United States Patent [19]

Deppisch et al.

[11] Patent Number: 4,652,358
[45] Date of Patent: Mar. 24, 1987

[54] SPUTTERING CATHODE

[75] Inventors: Gerd Deppisch, Aschaffenburg; Klaus Röll, Hanau am Main; Karl-Heinz Schuller, Obertshausen, all of Fed. Rep. of Germany

[73] Assignee: Leybold-Heraeus GmbH, Cologne, Fed. Rep. of Germany

[21] Appl. No.: 644,503

[22] Filed: Aug. 24, 1984

[30] Foreign Application Priority Data

Aug. 31, 1983 [DE] Fed. Rep. of Germany ....... 3331406

[51] Int. Cl.$^4$ ............................................. C23C 14/36
[52] U.S. Cl. .................. 204/298; 204/192.2; 219/121 ED
[58] Field of Search .............. 204/192 R, 192 M, 298; 219/121 EC, 121 ED, 121 EM

[56] References Cited

U.S. PATENT DOCUMENTS

| | | | |
|---|---|---|---|
| 4,169,031 | 9/1979 | Brors | 204/192 R |
| 4,324,631 | 4/1982 | Meckel et al. | 204/192 M |
| 4,405,436 | 9/1983 | Kobayashi et al. | 204/298 |
| 4,425,218 | 1/1984 | Robinson | 204/298 |
| 4,448,653 | 5/1984 | Wegmann | 204/298 |
| 4,500,409 | 2/1985 | Boys et al. | 204/298 |

*Primary Examiner*—John F. Niebling
*Assistant Examiner*—William T. Leader
*Attorney, Agent, or Firm*—Felfe & Lynch

[57] ABSTRACT

The invention relates to a cathode system for sputtering apparatus which includes a target plate of ferromagnetic material. A magnet system is situated behind the target plate and has opposed poles positioned so that at least a portion of the lines of force emerging from the poles passes out through the target and returns thereto. The target is placed on a floor which includes strips of ferromagnetic material in the area of the poles of the magnet system. These strips close the magnetic circuit between the magnet system and the target plate. The remainder of the floor is made of nonmagnetic material.

2 Claims, 6 Drawing Figures

SPUTTERING CATHODE

The invention relates to a cathode system for cathode sputtering apparatus, containing a target plate of ferromagnetic material, a magnet system situated behind the target plate and having opposed poles which are arranged in such a position relative to the target plate that at least a portion of the lines of force emerging from the poles passes out through the target plate and returns thereto, the target plate being a removable part of a tub-like hollow body in which the magnet system is housed.

A comparable cathode system for nonferromagnetic targets is disclosed by German publication DE-OS No. 30 47 113. The hollow body consists of a nonmagnetic material such as copper, and has the form of a rectangular tub with a parallelipipedal cavity closed at the bottom by a floor that is integral with the tub. On the bottom of the floor there is fastened, in full-surface engagement, a target plate which consists of the material that is to be sputtered. The pole faces extend to the immediate vicinity of the tub floor, so that the magnetic lines of force have to penetrate the tub bottom, which has a thickness of several millimeters, and also the target plate, until they form on the free target surface a closed tunnel of magnetic lines of force. This closed tunnel, which limits the glow discharge largely to the area of the target surface and thus increases the sputtering rate by a factor of 10 to 30, is of especial importance. Cathode systems of this type are referred to as magnetron cathodes. It so happens that, for equal geometry of the magnet system and equal field strength, that portion of the lines of force which runs inside of the tub floor is unusable. To compensate this effect, therefore, even in the case of target plates of nonmagnetic materials, a magnet system of correspondingly larger dimensions must be used. The magnet materials that are here involved, however, are extremely expensive. Also, in the case of target plates of magnet materials, such as those which have to be used in the manufacture of magnetic recording tapes, much more serious problems arise.

In the case of ferromagnetic target plates, the magnetic flux is largely short-circuited by the target material, so that no magnetic field of sufficient field strength can be built up in front of the target surface with the systems used heretofore. It is basically possible to obviate this problem either by applying external magnets in front of or alongside the target plate, or by forming pole faces on the target plate itself, for example by means of grooves or steps, or by heating the target plate beyond its Curie point.

Providing externally placed magnet poles alone leads, however, to deep and narrow sputtering zones (called "erosion ditches") and thus to a poor utilization of the material. Furthermore, the magnet system itself is sputtered to a more or less great extent, and this is extremely undesirable since the coating properties are affected and a gradual "consumption" of the cathode system results. Grooves, slots or steps in ferromagnetic target plates likewise lead to erosion ditches which are very much limited spatially, and thus also result in a poor utilization of material. Another consequence is an undesirably greater amount of machining in making the target. The heating of the target plates beyond the Curie point leads to a high thermal stress on the substrates on the one hand, and calls for complex cathode designs to enable the thermal problems to be overcome.

Another possibility for the sputtering of ferromagnetic materials consists in bringing about a magnetic saturation of the target plate. The required magnetic mass depends both on the thickness and on the magnetization of the target plates, and on the optimation of the magnetic circuit. Technically feasible magnet systems necessitate target plates of only slight thickness, which in the case of highly ferrous target materials, for example, is less than about 2 to 3 mm, and in the case of target material of high nickel content it is less than about 5 mm. This is based on the consideration that the magnetic field strength at the target surface should amount to at least about 400 oersteds.

While on the one hand the principle of magnetic saturation can be considered as the simplest way of sputtering ferromagnetic materials, when conventional magnetron designs are used it leads to the use of thin ferromagnetic target plates and hence to frequent replacement of the target plates and long periods of idleness of the entire vacuum system, thereby tying up a great amount of capital investment.

The invention is therefore based on the problem of improving a cathode system of the kind described above, such that ferromagnetic target plates of greater thickness and hence of longer life will be able to be sputtered than heretofore.

THE INVENTION

The solution of this problem is accomplished by the invention in that ferromagnetic portions in the pole area of the magnetic system are placed directly, in a gap-less manner, against the rear side of the ferromagnetic target plate.

This teaching means that, between the pole faces and the back of the ferromagnetic target no air gaps or parts of nonmagnetic materials are provided.

German publication DE-OS No. 31 24 599 and U.S. Pat. No. 4,169,031 disclose the idea of bringing magnetic poles to the immediate vicinity of the back of the target. However, in the case of the nonferromagnetic targets specified, this results in no special advantage, since the target material in this case acts as an air gap.

The invention can be embodied on the basis of two fundamental principles of construction:

In a first advantageous embodiment, the hollow body has a floor on which to lay the target plate, while strips of ferromagnetic material are used in the floor in the area of the poles of the magnetic system, and these strips close the magnetic circuit between the magnet system and the target plate, while the remainder of the floor consists of nonmagnetic material—copper, for example.

In a second advantageous embodiment, the target plate is placed in a gas-tight and liquid-tight manner on a frame, and together with the frame constitutes the said hollow body, the magnet system itself reaching all the way to the back of the target plate.

By these measures a direct magnetic coupling of the magnetic flux produced by the magnet system is achieved, and the magnetic flux is carried in closed magnetic circuits which consist of the magnet system, the target plate, and magnetic parts or strips in some cases (first embodiment). The magnetic circuits are dimensioned such that the magnetic flux in the area of the target partially emerges from the target plate. The condition necessary for this is:

$$\Phi_L > M_s \cdot d \qquad (1)$$

In this formula,
($\Phi_L$=magnetic flux per unit of length)
$M_s$=saturation magnetization of the target material,
d=target thickness.

In a given target material the thickness of the target plates and the magnet system must be dimensioned in accordance with Equation 1. The rest of the magnetic circuit must be dimensioned such that there only a very small part of the magnetic tension produced by the magnet system is lost and only small losses of the magnetic flux occur. This is achieved in the case of the first embodiment by the use of highly permeable materials such as, for example, Permalloy, Mumetal, soft iron, etc., in the tub bottom, and by adequate cross sections and by the avoidance of gaps transversely of the magnetic flux. In the case of the second embodiment, it is achieved by the direct contact between the target plate and the magnetic poles. In this manner, the tension produced by the magnet system drops mainly in the area of the target plate, so that the target can become saturated. If at the same time the condition expressed by Equation 1 is fulfilled, the excess of the magnetic flux in front of the target surface builds up the known magnetic tunnel which suffices to sputter the target plate at a high rate.

In the presently known magnetron cathode, however, only a small portion of the magnetic tension is lost on the target plate, while most of it is lost at the gaps between the pole faces and the target plate and thus does not contribute to the building up of the magnetic tunnel on the target face.

It is especially advantageous to join the ferromagnetic strips to the nonmagnetic material of the tube by electron beam welding, because this produces only very slight mechanical tensions in the tub, and it is furthermore also possible to join together in a gas-tight and liquid-tight manner materials which are as good as non-weldable by other welding methods.

The subject of the application can be applied both to rotation-symmetrical cathode systems in which the hollow body is in the form of a kind of circular pot, and to cathode systems of rectangular symmetry, in which the hollow body has a parallelipipedal inner chamber, as for example in the case of German publication DE-OS No. 30 47 113.

Examples of the embodiment of the invention will be further explained below in conjunction with FIGS. 1 to 6, which show only the parts of the cathode system that are essential to its operation, in a highly diagrammatic representation.

BRIEF DESCRIPTION OF THE DRAWING

In FIG. 1 there is shown a cathode system 1 which has a tub-like hollow body 2 consisting of a frame 3 and a floor 4, which surround an approximately parallelipipedal cavity 5.

Figures 1, 2:
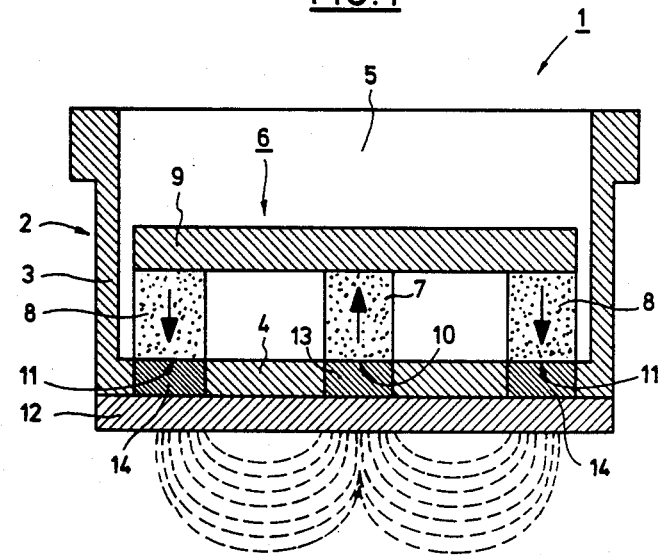
FIG. 1 is a cross section taken through a cathode system having a hollow body which has a floor against which the target plate is placed.
FIG. 2 is a cross section through a cathode system similar to FIG. 1, in which, however, the floor of the hollow body is formed by the target plate itself.

The hollow body 2 is fastened to a support plate, not shown, by which the cathode system is in turn connected to a vacuum chamber, also not shown. Details of such a system can be seen in German publication DE-OS No. 30 47 113.

In the cavity 5 there is a magnet system 6 which consists of numerous permanent magnets 7 and 8. The permanent magnets 7 are in linear rows and disposed in the center, while a closed chain of permanent magnets 8 surrounds the permanent magnets 7 with space intervening. The permanent magnets have the polarity defined by the arrows in the drawing, i.e., in the case of the central permanent magnets 7, all the north poles, for example, are at the top, while in the outer permanent magnets 8 all the south poles are at the top.

All of the permanent magnets are in contact at their upper pole faces with a ferromagnetic yoke plate 9, while the opposite pole faces 10 and 11 lie on the floor 4. A target plate 12 is joined to this floor, in full-surface contact therewith, by full-surface soldering, for example.

In the area of the pole faces 10 and 11, strips 13 and 14 of ferromagnetic material are inserted into the floor 4 of the hollow body 2, and have the same thickness as the floor 4, while the bottom and top surfaces of the strips on the one hand and of the floor on the other lie in common planes, i.e., are flush with one another. The vertical seams visible in FIG. 1 were produced by electron beam welding, so that the hollow body 2 with the strips 13 and 14 constitute an integral component. In the manner described, no air gaps are present between the permanent magnets 7 and 8 and the target plate 12; instead, the entire interval in the pole area of the magnet system is filled by ferromagnetic parts or the above-described ferromagnetic strips.

Consequently, a closed magnetic tunnel is formed over the relatively thick ferromagnetic target plate 12, as indicated by the broken lines representing the magnetic lines of force, assuming that the equation given above holds true.

In FIG. 2, parts equal to those of FIG. 1 are provided with the same reference numbers, so as to avoid repetition. In this case, however, the frame is not equipped with a special floor, and instead forms a frame 3a on which the target plate is placed directly in a gas-tight and liquid-tight manner. Thus, it forms a hollow body together with frame 3a, and the magnet system 6 is brought directly against the back of the target plate 12. In this case, therefore, the ferromagnetic parts are formed by the permanent magnets 7 and 8 themselves or by their pole faces 10 and 11, and thus the magnetic flux circuit is similarly completed, as in the subject of FIG. 1.

Figure 3:
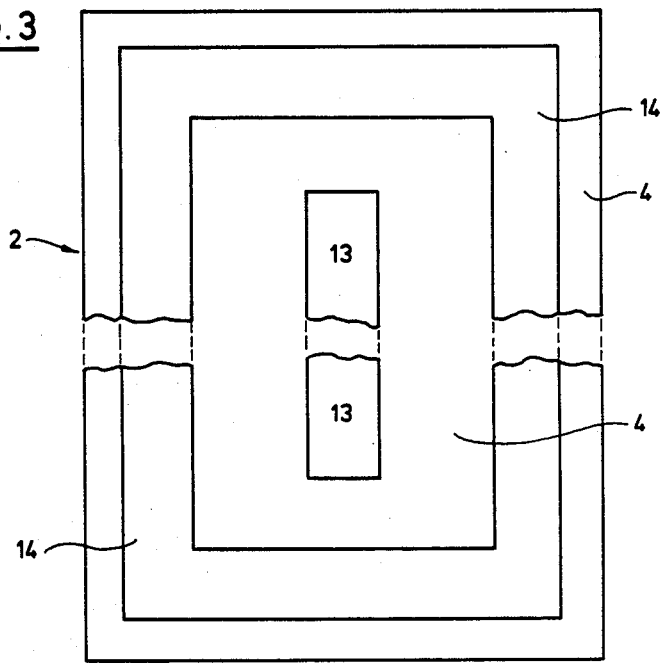
FIG. 3 is a bottom view of the subject of FIG. 1, FIGS. 4 to 6 show different embodiments of the magnet system.

FIG. 3 represents a bottom view of the subject of FIG. 1, but without the target plate 12. The bottom 4 can be seen, with the inserted ferromagnetic strips 13 and 14. The inner ferromagnetic strip 13 is of a linear configuration; the outer ferromagnetic strips 14 surround the inner ferromagnetic strip 13 in the manner of a rectangular frame. The frame can be made in one piece, but it can also consist of a plurality of strip-like parts which are joined together also in a liquid-tight manner, preferably by electron beam welding. It is evident that the corners of the frame constituted by the outer strips 14 can also be rounded. The length of the cathode system is virtually unlimited, as indicated by the interruption lines. The pole faces 10 and 11 of the magnet system 6 are congruent in their position with the position of the strips 13 and 14 in FIG. 3. Also the position of the pole faces 10 and 11 in the subject of FIG. 2 would coincide in projection with the subject of FIG. 3.

Figure 4:
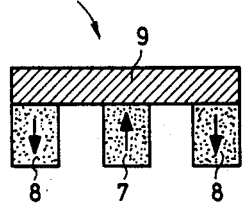

FIG. 4 represents a magnet system 6, such as corresponds to that of FIGS. 1 and 2.

Figure 5:
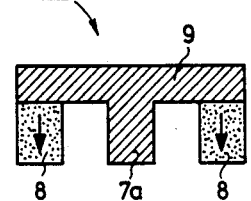

In the magnet system 6a of FIG. 5, only the outer crown of permanent magnets 8 is present, while the inner permanent magnet is replaced by a pole shoe 7a at the yoke plate 9.

Figure 6:
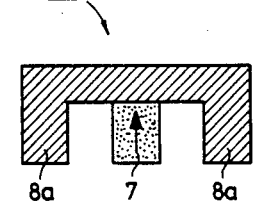

In the magnet system 6b of FIG. 6, the situation is the reverse of that of FIG. 5. Here the inner permanent magnet 7 is present, while the crown of outer permanent magnets is replaced by a continuous annular pole shoe 8a.

It can be seen from FIGS. 5 and 6 that the magnet mass can be considerably reduced, so that a minimum magnet mass can be achieved in the embodiment shown in FIG. 6. Nevertheless, the magnet systems of FIGS. 5 and 6 are usable to advantage in the subject of the invention, because the reduction of the magnetic losses to a minimum permits the use of correspondingly smaller magnet mass.

It is apparent that, in all embodiments, the magnet systems are coupled to the target plate magnetically, either directly or by means of ferromagnetic or soft-magnetic transition pieces. In the embodiments of FIGS. 5 and 6, it is the pole shoes 7a and 8a which reach directly to the magnetic strips 13 and 14 (FIG. 1) or to the target plate 12 (FIG. 2). The ferromagnetic strips 13 and 14 in FIG. 1 thus constitute a prolongation of the pole shoes 7a and 8a.

We claim:

1. Cathode system for sputtering apparatus, containing a target plate of ferromagnetic material, a magnet system having opposed poles situated behind the target plate, which are disposed in such a position relative to the target plate that at least a portion of the field lines emerging from the poles passes out through the target plate and back into the latter, the target plate being a removable part of a tub-like hollow body in which the magnet system is housed, characterized in that ferromagnetic parts in the pole of the magnet system are brought gap-free directly against the back of the ferromagnetic target plate, and further characterized in that the hollow body has a floor for the placement thereon of the target plate, that strips of ferromagnetic material are inserted in the floor in the area of the poles of the magnet system and close the magnetic circuit between magnet system and target plate, and that the rest of the floor consists of nonmagnetic material.

2. A method of producing a cathode system for sputtering apparatus, said cathode system containing a target plate of ferromagnetic material, a magnet system having opposed poles situated behind the target plate, which are disposed in such a position relative to the target plate that at least a portion of the field lines emerging from the poles passes out through the target plate and back into the latter, the target plate being a removable part of a tub-like hollow body in which the magnet system is housed, characterized in that ferromagnetic parts in the pole of the magnet system are brought gap-free directly against the back of the ferromagnetic target plate, and further characterized in that the hollow body has a floor for the placement thereon of the target plate, that strips of ferromagnetic material are inserted in the floor in the area of the poles of the magnet system and close the magnetic circuit between magnet system and target plate, and that the rest of the floor consists of nonmagnetic material, said method comprising the step of joining the ferromagnetic strips to the nonmagnetic material of the floor by electron beam welding.

* * * * *